US008271566B2

(12) United States Patent (10) Patent No.: US 8,271,566 B2
Droz et al. (45) Date of Patent: Sep. 18, 2012

(54) APPARATUS AND METHOD FOR TIME-SERIES STORAGE WITH COMPRESSION ACCURACY AS A FUNCTION OF TIME

(75) Inventors: Patrick Droz, Rueschlikon (CH); Paul T. Hurley, Zurich (CH); Andreas Kind, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 1420 days.

(21) Appl. No.: 11/846,966

(22) Filed: Aug. 29, 2007

(65) Prior Publication Data

US 2009/0063603 A1    Mar. 5, 2009

(51) Int. Cl.
 *G06F 7/00* (2006.01)
(52) U.S. Cl. ........................................................ 708/203
(58) Field of Classification Search .................... 708/203
 See application file for complete search history.

(56) References Cited

U.S. PATENT DOCUMENTS

| 7,260,272 | B2* | 8/2007 | Lin et al. ................ 382/275 |
| 8,059,905 | B1* | 11/2011 | Christian ................ 382/254 |
| 2005/0249293 | A1* | 11/2005 | Zeng et al. ................ 375/240.29 |

OTHER PUBLICATIONS

Stephane Mallat. A Wavelet Tour of Signal Processing. Academic Press, 1998.
Gilbert Strang and Truong Nguyen. Wavelets and Filter Banks. Wellesley-Cambridge Press, Wellesley, MA, 1996.
Wavelets and Subband Coding [online]; [retrieved on Aug. 29, 2007]; retrieved from the Internet http://www.waveletsandsubbandcoding org/.

* cited by examiner

*Primary Examiner* — Tan V. Mai
(74) *Attorney, Agent, or Firm* — Cantor Colburn LLP; Daniel Morris

(57) ABSTRACT

The present invention provides a system and method for time-series with compression accuracy as a function of time. Briefly described, in architecture, one embodiment of the system, among others, can be implemented as follows. The system includes a computer with a processor. The system performs a method receiving a data set on the computer, utilizing a plurality of filter banks to transform the data set into a plurality coefficients, wherein each coefficient is associated with a basis function, and quantizing the plurality of coefficients, wherein the quantization maps the plurality of coefficients into certain value ranges. Then, system further performs determining a threshold based upon each coefficient effect on a time domain, disregarding the coefficient that fall below the threshold, and storing any remaining coefficients as compressed data for the data set.

6 Claims, 3 Drawing Sheets

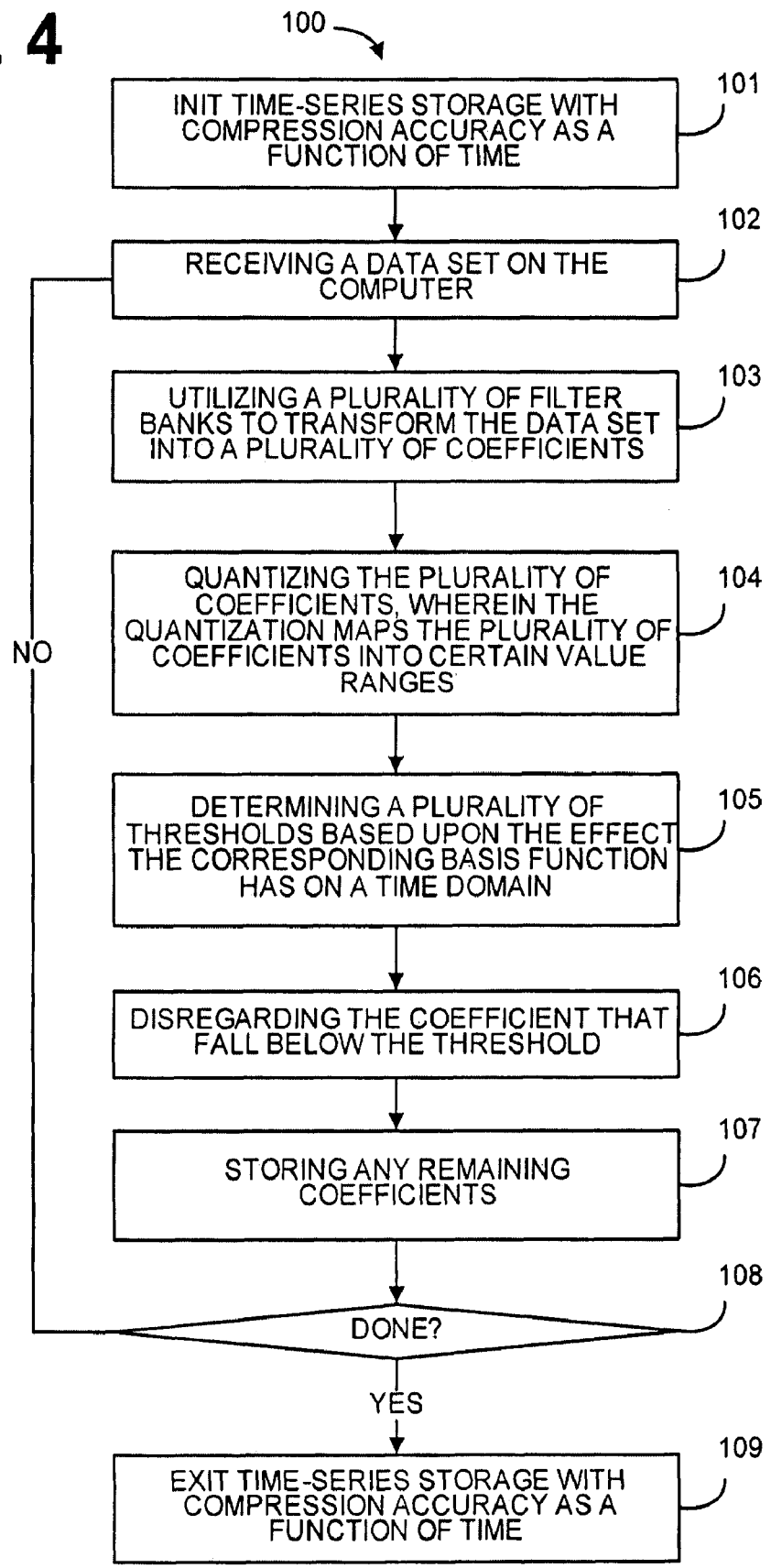

APPARATUS AND METHOD FOR TIME-SERIES STORAGE WITH COMPRESSION ACCURACY AS A FUNCTION OF TIME

BACKGROUND OF THE INVENTION

Time-series data has traditionally been stored as raw data or as rows of a relational database. Handling, reading and manipulation can then be extremely cumbersome, and in the relational database case, inefficient.

A related IBM technology is Aggregated Database (ADB). ADB is a method to store time-series which essentially works by dividing the time axis into blocks which are treated independently. The average of the signal over each block is obtained and stored in an array. While it has proven so far extremely useful for AURORA (particularly it is extremely fast), it has certain disadvantages, which include: It requires multiple databases to deal with different accuracy requirements depending on the time-scale (hour, day, month, year, etc.) The lossy compression space/accuracy tradeoff performance is not good. The artificial partitioning of the time axis induces block effects (i.e. lack of smooth transitions) and does not permit exploitation of compression across blocks.

One popular method for storing time-series information is the freely available Round-Robin Database (RRD). It creates fixed-size databases with data arrays of predetermined lengths, where multiple arrays are used to record samples of multiple variables or parameters. RRD circularly fills these arrays, such that only the most recent data samples are held, corresponding to a sliding window of the parameter time series. It can only be thought of as imposing degraded accuracy as a function of time in the extreme values outside of the circular buffer are lost. Disadvantages of RRD include that data arrays consume disk space for all potential aggregation data values, even if the data arrays are filled only sparsely and values are inserted for a specific point in time, despite the fact that, for many data measurement applications, the primary measurement data is concentrated over an interval and not at one specific instance.

The IBM InformixR® TimeSeries DataBlade™ module is an add-on for the IBM relational database Informix for the management of time-series and temporal data. It enables simplification in coding and permits complex queries. The time-series values are stored as a single row in a relational databases table. The traditional way is to store each (time-stamp, value) pair as one row. What is referred to as a calendar is used to encode the timestamps. There is also an associated IBM Informix-NAG Financial DataBlade module add-on that uses the well-known numerical analysis library NAG to perform complex calculations on TimeSeries data. The Informix TimeSeries DataBlade is a more natural way to store time-series data than the traditional relational method. However, this module boils down to an embedding of the data within the database, together with a framework to manipulate it. Neither compression nor a time/accuracy tradeoff appear to be offered, as options.

SUMMARY OF THE INVENTION

Embodiments of the present invention provide a system and method for time-series storage with compression accuracy as a function of time. Briefly described, in architecture, one embodiment of the system, among others, can be implemented as follows. The system includes a computer with a processor. The system performs a method receiving a data set on the computer, utilizing a plurality of filter banks to transform the data set into a plurality coefficients, wherein each coefficient is associated with a basis function, and quantizing the plurality of coefficients, wherein the quantization maps the plurality of coefficients into certain value ranges. Then, system further performs determining a plurality of thresholds based upon the effect of the corresponding basis function of each coefficient on a time domain, disregarding the coefficient that falls below the threshold, and storing any remaining coefficients.

Embodiment of the present invention can also be viewed as providing methods for time-series storage with compression accuracy as a function of time. In this regard, one embodiment of such a method, among others, can be broadly summarized by the following steps. The method operates by receiving a data set on the computer, utilizing a plurality of filter banks to transform the data set into a plurality coefficients, wherein each coefficient is associated with a basis function, and quantizing the plurality of coefficients, wherein the quantization maps the plurality of coefficients into certain value ranges. Then, the method further operates by determining a threshold based upon each coefficient effect on a time domain, disregarding the coefficient that fall below the threshold, and storing any remaining coefficients as compressed data for the data set.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, but instead emphasis being placed upon to clearly illustrate the principles of the present invention. Moreover, in the drawings, like reference numerals designate corresponding parts throughout the several views.

FIG. 4 is a flow chart of the method for the time-series with compression accuracy as a function of time system of the present invention.

DETAILED DESCRIPTION

Figure 1:
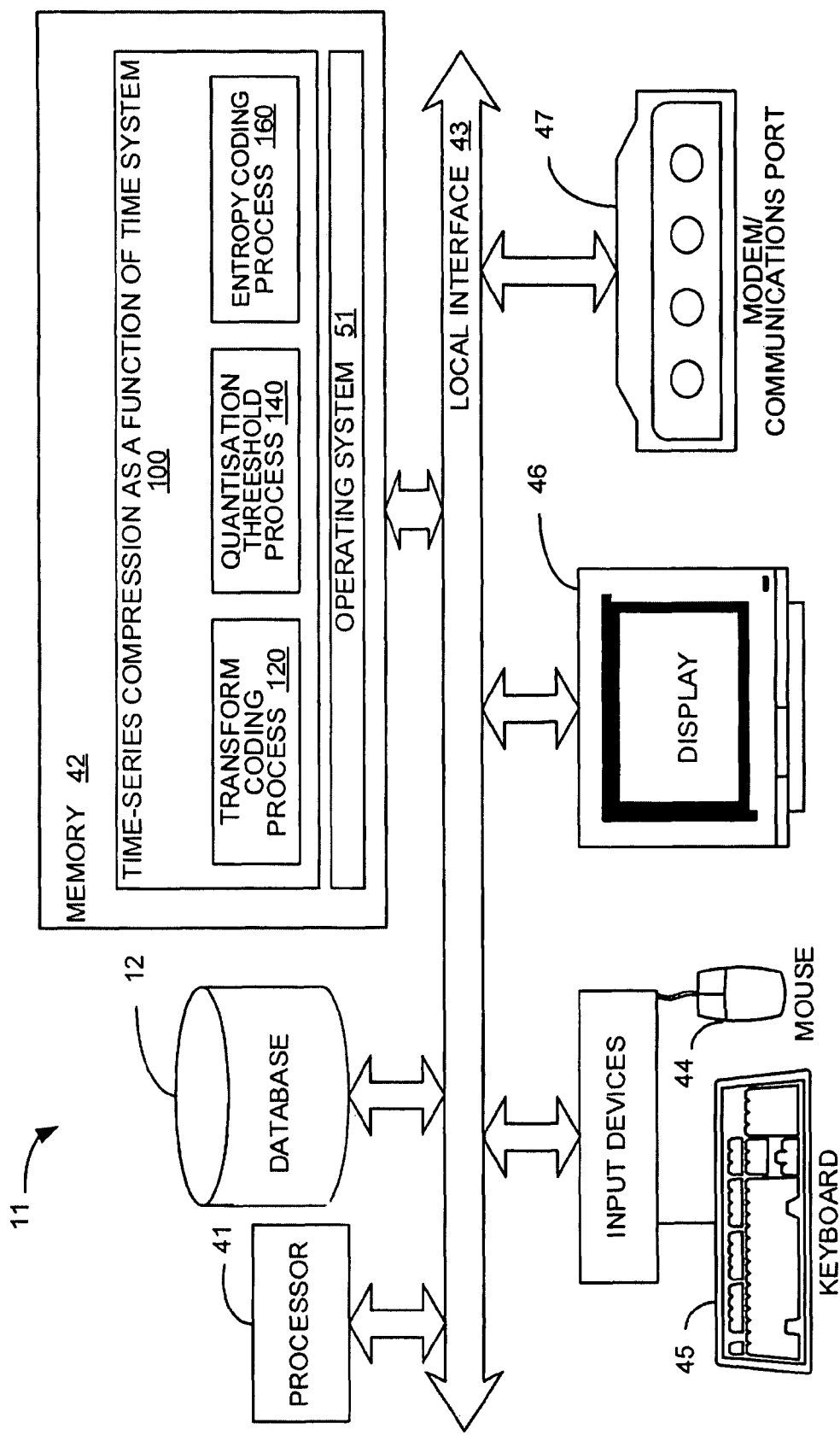
FIG. 1 is a block diagram illustrating an example of a computer utilizing the time-series with compression accuracy as a function of time system of the present invention.

The present invention generally relates to measurement processes and electronic archiving and aggregation of time-series data in databases. A measurement process also referred to as a probing or sampling process, may generate numerical values that have to be electronically archived in a database for later processing, analysis, graphical presentation, proof or verification, diagnosis or other reasons. The invention provides a mechanism for the efficient preprocessing, insertion, and storage of numeric measurement data in databases.

More specifically, the invention specifically enables time-series data to be compressed efficiently such that the most recent data is stored with the highest fidelity while older data is stored with decreasing fidelity. More generally, the invention enables strategies to be employed that vary fidelity based on the relationship of data to the time axis.

The present invention enables lossy compression of (primarily one-dimensional) discrete signals with optimized accuracy and space-consumption, given non-uniform fidelity criteria in the time domain. The invention is a new group of compression methods (i.e. algorithms) that achieve accuracy approximation as a function of time.

The background of this invention lies in network profiling and, in particular, IBM's AU-RORA product. It will be used to speed up database usage, potentially magnitudes faster. New features and flexibility are facilitated by the invention. IBM® is a registered trademark of International Business Machines Corporation, Armonk, N.Y., U.S.A. Other names used herein may be registered trademarks, trademarks or product names of International Business Machines Corporation or other companies.

Additionally, the scope of the invention goes far beyond network profiling, and could cater for many time-series. It has, for example, practical uses in financial, geological, economic time-series storage or in storing output from physical measurements such as sensors. One example embodiment would be as an add-in to DB2, which would facilitate customers to re-use and/or migrate their existing code-base.

There is no equivalent to JPEG or MP3 or other compression formats in this domain. Of course, there are certain cases when not losing any information is a requirement or necessary. Just as there are those applications that require lossless image compression (i.e. such as certain medical imaging as mandated by law), there are also those applications that will need full resolution of the time-series. However, there is also a large demand for lossy compression for storage and complexity reduction as well as faster transportation. The invention also offers fast manipulation of data using filter coefficients.

The invention has a different philosophy than the prior art and a number of advantages. It uses much less space to represent the data while facilitating database manipulation. Additionally, the overhead of DB2 is not needed.

The Informix module has no lossy compression which means the entire data is preserved with full fidelity, and the relational database framework facilitates deployment in some instances. What is gained by preservation of the fidelity of the input is lost in magnitudes more storage space and increased complexity in manipulation, which may not be worthwhile.

Consider a one-dimensional discrete sequence $x=(x[0], \ldots, x[n])$, consisting of real numbers, to be compressed. It could represent, for example, a signal sampled at some rate T.

Each sample $x[i]$ represents some point i in time. The most recent value is $x[n]$. Another sequence $\hat{x}=(\hat{x}[0], \ldots, \hat{x}[n])$ that is called the approximation of the original signal (or sequence) x. This approximation is typically the result of a decompression step. If compression/decompression introduced no errors than the $\hat{x}=x$ and the compression is lossless. However, our main focus, for space and complexity reasons, is to consider the lossy case whereby $\hat{x} \cong x$.

To measure how close the approximation $\hat{x}$ is away from the original x, one can use a distance function (or metric) $d(\cdot, \cdot)$. For example, a very common distance function is the root mean square (square of the mean-square error).

$$d(x, \hat{x}) := \sqrt{\sum_{i=0}^{n} (x[i] - \hat{x}[i])^2}.$$

Such a distance measure is time-invariant: the error introduced between every original sample and its approximation is valued equally without bias.

This uniformity may make perfect sense in many applications. For example, when approximating music, there is no reason, a priori, to favor the end of a song over its middle. Such rationale also extends to image compression.

The motivation of the present invention was the creation of a method using an algorithm for the case when a representative distance measure cannot be ascertained without explicit dependence on the value of the time-axis. For example, this situation arises when storing network profiling data.

Biased accuracy approximation is a mathematical concept we introduce whereby the reduction of approximation error is explicitly time-variant, namely the cost of an approximation error depends on where on the time-axis the error occurs. A specific case, sliding accuracy approximation, captures the details behind a "time-aware" approximation whereby the approximation errors that occur in the recent past are treated as more expensive than those which occur further in the past.

Biased accuracy can considered as an unconstrained optimization problem with the biased-accuracy factored into the optimization goal. Thus, one way to capture a form of biased-accuracy is to consider a distance function defined as above but with weights to explicitly capture the bias. Let $\omega=(\omega[i])$ be a signal of weights resulting in a distance measure adapted from the root-mean square:

$$d(x,\hat{x}):=\sqrt{\Sigma \omega_i^2 (x[i]-\hat{x}[i])^2}.$$

This arrives directly from what is known as a weighted inner-product. Measures other than the root-mean square can also be adapted (e.g. PSNR—Peak Signal to Noise Ratio). $\omega$ reflects the relative importance of accuracy in each component. This measure can be seen to using $\omega$ to transform (scale) the input $x[i] \rightarrow \omega i \, x[i]$ (with the output accordingly scaled) and then applying the root-mean square. For example, if $\omega$ is a decreasing signal, then it reflects a requirement for sliding accuracy.

Let $\beta = \{\phi_i\}$ be a basis over some space, more precisely a Hilbert space on discrete sequences, and $I=\{1, 2, \ldots\}$ be an indexing set to this basis (i.e. natural numbers). The expansion of x over this basis is:

$$x[n] := \sum_{i \in I} \langle \phi_i, x \rangle \phi_i[n].$$

An approximation $\hat{x}$ of x composed using m basis functions from $\beta$ indexed by a set $L \subseteq I$ is, $$\hat{x}[n] := \sum_{i \in L} \langle \phi_i, x \rangle \phi_i[n]. \qquad (2)$$

This is a linear approximation when L is a set independent of the input (i.e. typically then $L\{1, 2, \ldots, m\}$, determining the first m basis functions) 4, and nonlinear otherwise. Linear approximation is obviously easier (quicker with no requirement to store a different L for each compressed signal 90) but nonlinear approximation chosen to minimize error necessarily results in a more accurate representation of the signal.

j Nonlinear approximation can minimize error by picking basis functions that are time-localized to handle discontinuities and other artifacts, placing emphasis and concentrating coding on where it is need. With biased accuracy, we have an incentive to pick a time-localized basis function—but ones that reflect the relative importance of that part of the signal. In other words, we have a double adaptation or two variable optimization problems: adapt to the signal and to the relative importance of the time.

FIG. 1 is a block diagram illustrating an example of a computer utilizing the time-series with compression accuracy as a function of time system 100 of the present invention. Generally, in terms of hardware architecture, as shown in FIG. 1, the computer device 11 includes a processor 41, memory 42, and one or more input and/or output (I/O) devices (or peripherals), such as data base or storage 12, that are communicatively coupled via a local interface 43. The local interface 43 can be, for example but not limited to, one or more buses or other wired or wireless connections, as is known in the art. The local interface 43 may have additional elements, which are omitted for simplicity, such as controllers, buffers (caches), drivers, repeaters, and receivers, to enable communications. Further, the local interface 43 may include address, control, and/or data connections to enable appropriate communications among the aforementioned components.

The processor 41 is a hardware device for executing software that can be stored in memory 42. The processor 41 can be virtually any custom made or commercially available processor, a central processing unit (CPU) or an auxiliary processor among several processors associated with the computer 11, and a semiconductor based microprocessor (in the form of a microchip) or a macroprocessor. Examples of some suitable commercially available microprocessors include, but are not limited to: an 80x86, Pentium, Celeron, Xeon or Itanium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 42 can include any one or combination of volatile memory elements (e.g., random access memory (RAM, such as dynamic random access memory (DRAM), static random access memory (SRAM), etc.)) and nonvolatile memory elements (e.g., read only memory (ROM), erasable programmable read only memory (EPROM), electronically erasable programmable read only memory (EEPROM), programmable read only memory (PROM), tape, compact disc (CD-ROM), DVD read on memory, magnetic disk, diskette, cartridge, cassette or the like, etc.). Moreover, the memory 42 may incorporate electronic, magnetic, optical, and/or other types of storage media. Note that the memory 42 can have a distributed architecture, where various components are situated remote from one another, but still can be accessed by processor 41.

The software in memory 42 may include one or more separate programs, each of which comprises an ordered listing of executable instructions for implementing logical functions. In the example illustrated in FIG. 1, the software in the memory 42 includes, but is not limited to, a suitable operating system (O/S) 51 and the time-series with compression accuracy as a function of time system 100 of the present invention. The time-series with compression accuracy as a function of time system 100 further includes the transform coding process 120, quantization threshold process 140 and entropy coding process 160. The software components will be described in further detail with regard to FIG. 2.

A nonexhaustive list of examples of suitable commercially available operating systems 51 is as follows: (a) a Windows operating system available from Microsoft Corporation; (b) a Netware operating system available from Novell, Inc.; (c) a Macintosh operating system available from Apple Computer, Inc.; (e) a UNIX operating system, which is available for purchase from many vendors, such as the Hewlett-Packard Company, Sun Microsystems, Inc., IBM and AT&T Corporation; (d) a LINUX operating system, which is freeware that is readily available on the Internet; (e) a run time Vxworks operating system from WindRiver Systems, Inc.; or (f) an appliance-based operating system, such as that implemented in handheld computers or personal data assistants (PDAs) (e.g., Symbian OS available from Symbian, Inc., Palm OS available from Palm Computing, Inc., and Windows Mobile available from Microsoft Corporation).

The operating system 51 essentially controls the execution of other computer programs, such as the time-series with compression accuracy as a function of time system 100, and provides scheduling, input-output control, file and data management, memory management, and communication control and related services. However, it is contemplated by the inventors that the time-series with compression accuracy as a function of time system 100 of the present invention is applicable on all other commercially available operating systems.

The time-series with compression accuracy as a function of time system 100 may be a source program, executable program (object code), script, or any other entity comprising a set of instructions to be performed. When a source program, then the program is usually translated via a compiler, assembler, interpreter, or the like, which may or may not be included within the memory 42, so as to operate properly in connection with the O/S 51. Furthermore, the time-series with compression accuracy as a function of time system 100 can be written as (a) an object oriented programming language, which has classes of data and methods, or (b) a procedure programming language, which has routines, subroutines, and/or functions, for example but not limited to, C, C++, Pascal, BASIC, FORTRAN, COBOL, Perl, Java, ADA and the like.

The I/O devices may include input devices, for example but not limited to, a keyboard 45, mouse 44, scanner (not shown), microphone (not shown), etc. Furthermore, the I/O devices may also include output devices, for example but not limited to, a printer (not shown), display 46, etc. Finally, the I/O devices may further include devices that communicate both inputs and outputs, for instance but not limited to, a NIC or modulator/demodulator 47 (for accessing other files, devices, systems, or a network), a radio frequency (RF) or other transceiver (not shown), a telephonic interface (not shown), a bridge (not shown), a router (not shown), etc.

If the computer 11 are a mainframe, PC, workstation, intelligent device or the like, the software in the memory 42 may further include a basic input output system (BIOS) (omitted for simplicity). The BIOS is a set of essential software routines that initialize and test hardware at startup, start the O/S 51, and support the transfer of data among the hardware devices. The BIOS is stored in some type of read-only-memory, such as ROM, PROM, EPROM EEPROM or the like, so that the BIOS can be executed when the computer is activated.

When the computer 11 is in operation, the processor 41 is configured to execute software stored within the memory 42, to communicate data to and from the memory 42, and to generally control operations of the computer pursuant to the software. The time-series with compression accuracy as a function of time system 100 and the O/S 51 are read, in whole or in part, by the processor 41, perhaps buffered within the processor 41, and then executed.

When the time-series with compression accuracy as a function of time system 100 is implemented in software, as is shown in FIG. 1, it should be noted that the time-series with compression accuracy as a function of time system 100 can be stored on virtually any computer readable medium for use by or in connection with any computer related system or method. In the context of this document, a computer readable medium is an electronic, magnetic, optical, or other physical device or means that can contain or store a computer program for use by or in connection with a computer related system or method. The time-series with compression accuracy as a function of time system 100 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Figure 2:
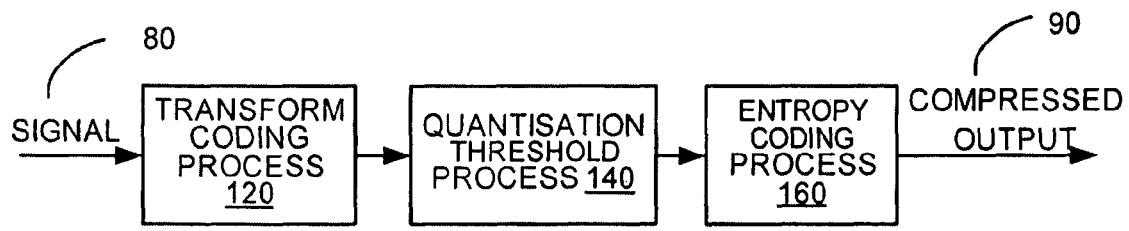
FIG. 2 is a block diagram illustrating an example of a coder to compress data utilizing the lossy compression of discrete signals in the time domain system of the present invention, as shown in FIG. 1.

FIG. 2 is a block diagram illustrating an example of a transform coding process 120 to compress data utilizing the lossy compression of discrete signals in the time domain system of the present invention, as shown in FIG. 1. FIG. 2 shows the steps typically taken by a transform coding process 120 to compress data in a lossy fashion.

The transform coding process 120 is the output of the analysis stage of a filter bank. The next step involves the quantization of the data to a certain value range and may apply a quantization threshold process 140. Quantization where all values of the transform that are close to 0 (or below some value 7) are set to 0. The last (optional) stage, entropy coding process 160, is lossless compression of the quantized coefficients using, for example, Huffman or arithmetic coding. Additionally, the invention need not implement an entropy coding process 160 at all—it is then faster, simpler while data manipulation becomes more convenient. It is also possible to perform entropy coding 160 (resp. decoding) only when writing the values from (resp. to) memory to (resp. from) disc.

The exemplary invention also consists of these steps with different transform coding 120 and quantization threshold process 140. The entropy coding process 160 can, at least for one implementation, be seen as orthogonal, and standard methods used. Alterations in data treatment prior to his step have only minor influence on how entropy coding 160 should be performed. Thus, one can apply the "time-aware" exemplary invention at the transform coding 120 and quantization threshold process 140. In practice, the present invention provides a combination of both.

If the signal 80 is non-contiguous (sampled at irregular intervals), a realignment to a representative contiguous signal can be performed prior to further processing (i.e. the best representation of the data sampled at spacing of T seconds could be obtained). If the input data naturally emits a continuous signal representation, it can be sampled appropriately (as usual) to obtain a discrete signal.

Without restricting the invention in any way, one embodiment can have a maximum database size M. If there is no entropy coding step this maximum size can be interpreted as requiring no more than M basis (or equivalently transform) coefficients be stored. This is the embodiment we focus on.

There are two modes of operation that arise depending on the nature of the input: static and adaptive. Static is when you have only the entire original time-series, and adaptive is when only part of the input is available at any given time, and the compressed information stored must be updated. An algorithm should ideally be tailored to an appropriate time-series model for the input. This may require a training step.

In a sense, relative importance is place in the time-domain—a bit like how standard compression worries about important frequencies in the frequency-domain. The stages of the invention of transform coding 120 and then quantization threshold process 140 will now be described. It's not necessarily a case of adapting to changes in signal changes (non-stationary nature), although that is also needed. Rather, the exemplary invention adapts to the changes of the relative importance of the parts of the signal.

An appropriate filter bank 130 with quantization as a biased accuracy enforcer will not provide good performance. Instead, in this embodiment the filter-bank tree structure is changed over time, vary the tree depth (ignore tree for older values) (i.e. vary the channels as a function of time). For example, go to higher frequencies in later time but forget them as time goes by. This has the effect of modifying the basis functions.

Typically, the basis is chosen from a family of them, using the best-basis algorithm or a variant thereof. Three goals then result: basis family design: create a good basis family that suits the type of signal and biased accuracy goal; basis selection: for a given input, choose the best basis; choice of coefficients: within that basis, choose the best basis functions.

The third one is handled by the quantizer. For this embodiment, we assume an appropriate choice of a family of filter-banks 130. The focus is then on the best basis selection by varying the tree.

The quantization and/or thresholding of the basis coefficients which can be determined by the biased accuracy goal. Of course shortcuts in all these steps, for complexity and storage reasons, may be appropriate. For example, in the most extreme case, the basis functions used in the approximation are completely independent of the signal, and a linear approximation is performed.

After the transform coding 120 is performed, a basis decomposition of the signal is the result. The choice of which values to keep is the goal of the quantization threshold process 140. Thresholding amounts to setting all basis coefficients to zero which are below some value T, which is equivalent to dropping these basis coefficients. Quantization threshold process 140 is the step of mapping the basis coefficients into a certain value range.

In standard methods, the thresholding is done so as to reduce the overall error. As the invention's goal is explicit time consideration, the goal is now to reduce the modified error which factors in this time consideration. The optimal goal is to throw away as few coefficients as necessary in order to meet this goal.

The step here is the choice of which bias the quantization or thresholding (older values cut down more; higher frequencies ignored); Non-uniform quantizers that quantize according to a non-increasing function which biases accuracy someway or other are also possible embodiments. One goal is the design of a cleaning method (i.e. algorithm) for a given tree as input, such that the measurements are most accurate according to the design.

The exemplary invention is described using a two-channel filter bank 130, although we in no way limit it to two channels. Further embodiments with multiple-channel filter banks would be clear to those skilled in the art.

Figure 3:
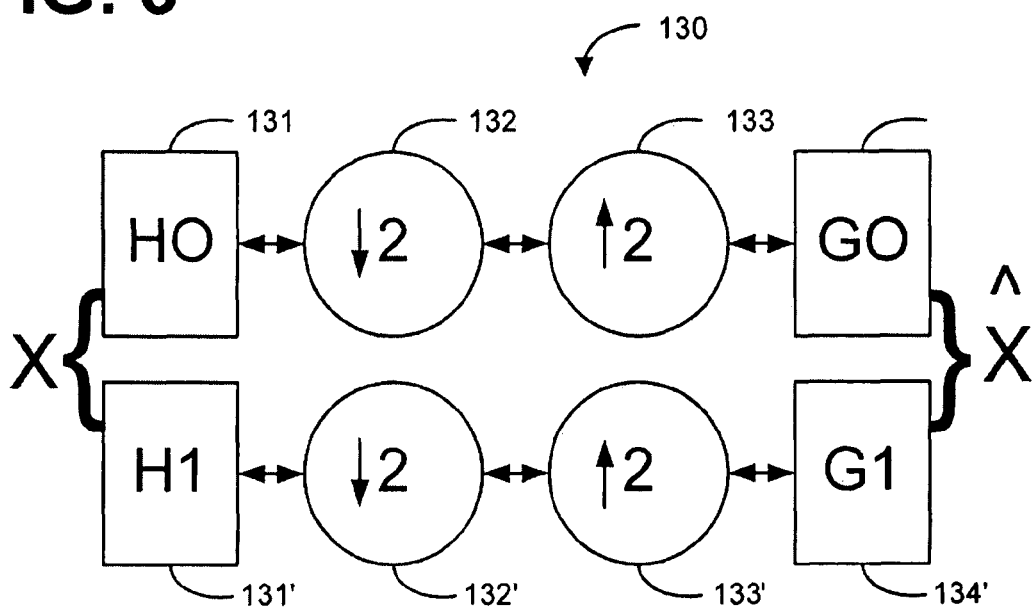
FIG. 3 is a block diagram illustrating an example of a two channel filter bank as one step in the process to compress data utilizing the lossy compression of discrete signals in the time domain system of the present invention, as shown in FIG. 2.

FIG. 3 is a block diagram illustrating an example of a two channel filter bank 130 to compress data utilizing the lossy compression of discrete signals in the time domain system of the present invention, as shown in FIG. 2. Filter banks and basis expansions are intertwined. In particular, a basis expansion can be obtained using a number of filters in harmony.

A filter is defined to be a linear time-variant operator. A downsampler with integer factor N outputs every Nth value of the input e.g. if x=(x[0], x[1], ..., ) then a downsampler with factor 2 outputs (x[0], x[2], x[4], x[6], ... ). An upsampler with integer factor M inserts M-1 consecutive zeros in between samples of the input e.g. if x=(x[0], x[1], ..., ) then an upsampler with factor 3 outputs (x[0], 0, 0, x[1], 0, 0, x[2], 0, 0, ... ).

A filter bank 130 consists of a set of filters with downsampling 132/132' and/or upsampling 133/133' operators. For example consider the two example filter banks shown in FIG. 3. The first is the analysis filter bank 131-134, and the second the synthesis filter bank 131'-134'. The two parts of the analysis filter bank 131 filter and then down sample the input signal (in practice both operations may be performed together).

The filter set {H0, H1, G0, G1} 131, 131', 134 and 134' can be suitably chosen such that, provided there is no further manipulation of the output compresses signal 90, the original signal 80 can be exactly reconstructed i.e. x=x̂ (allowing for a time-delay determined by the length of the filters and within the restrictions of potential round-off error in computer calculations). It is then said to be a perfect reconstruction filter bank. This usually requires that the filters be biorthogonal.

Filters that satisfy this criteria include orthogonal filters generated from wavelets, wavelet packets and local cosine bases. The present invention is not restricted to any particular filter. In any case, the best filters will depend on the application and the nature of the input data.

Illustrated in FIG. 4 is a flow chart of the method for the time-series with compression accuracy as a function of time system 100 of the present invention. First, the time-series with compression accuracy as a function of time system 100 is initialized to step 101. The initialization includes the establishment of data values for particular data structures utilized in the time-series with compression accuracy as a function of time system 100. At step 102, a data set is received on the computer 11. This data set may come form a variety of data sources including, but not limited to, database 12, mouse 44, keyboard 45 or modem 47.

At step 103, a plurality of filter banks is utilized to transform the data set received at step 102 into a plurality of coefficients. This is accomplished as described above, with regard to the transform coding process 120. Each coefficient is associated with a basis function. Basis coefficients include, but are not limited to C=(Ci . . . C1). Each basis coefficient Ci has a footprint [Fi1, Fi2]. The footprint represents where most of the corresponding basis function has its energy in the time domain.

At step 104, the plurality of coefficients are quantized. The quantization maps the plurality of coefficients into certain value ranges. At step 105, a plurality of thresholds are determined based upon the; effect of the corresponding basis function has on the time domain. This is accomplished as described above, with regard to the quantization threshold process 140.

At step 106, the coefficients that full below the threshold are disregarded. At step 107. Any remaining coefficients are stored as compressed data for the date is set.

At step 108, it is determined that there are more data sets to be processed. If there are more data sets to be processed, then the time-series storage with compression accuracy as a function of time system 100 returns to repeat steps one and two through 108. However, it is determined that no more data sets are to be processed, then the time-series storage with compression accuracy as a function of time system then exits at step 109.

The exemplary invention can take the form of an entirely hardware embodiment, an entirely software embodiment or an embodiment containing both hardware and software elements in the exemplary embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method for time-series storage with compression accuracy as a function of time, comprising:
   receiving a data set on the computer;
   utilizing a plurality of filter banks to transform the data set into a plurality of coefficients, wherein each coefficient is associated with a basis function;
   determining a plurality of thresholds based upon the effect the corresponding basis function as on a time domain;
   disregarding the coefficient that fall below the threshold; and
   storing any remaining coefficients as compressed data for the data set.

2. The method of claim 1, further comprising using lossless compression on the remaining coefficients.

3. The method of claim 1, wherein at determining a threshold step further comprising the step of utilizing a best basis algorithm for determining the threshold of the coefficient.

4. A computer system including a processor, the system comprising:
   a database;
   wherein the computer system performs a method comprising:
   receiving a data set on the computer;
   utilizing a plurality of filter banks to transform the data set into a plurality of coefficients, wherein each coefficient is associated with a basis function;

quantizing the plurality of coefficients, wherein the quantization maps the plurality of coefficients into certain value ranges;

determining a threshold for each coefficient based upon the effect its corresponding basis function has on a time domain;

disregarding the coefficients that fall below their threshold; and storing any remaining coefficients as compressed data for the data set.

5. The system of claim 4, wherein the utilizing a plurality of channel banks step further comprises:

using lossless compression on the remaining coefficients.

6. The system of claim 4, further comprising:

utilizing a best basis algorithm for determining the threshold of the coefficient.

* * * * *